(12) United States Patent
Godfried et al.

(10) Patent No.: US 9,933,709 B2
(45) Date of Patent: Apr. 3, 2018

(54) LITHOGRAPHIC APPARATUS AND METHOD

(71) Applicant: ASML NETHERLANDS B.V., Veldhoven (NL)

(72) Inventors: Herman Philip Godfried, Amsterdam (NL); Hubertus Petrus Leonardus Henrica Van Bussel, Asten (NL); Arij Jonathan Rijke, Eindhoven (NL); Wilhelmus Patrick Elisabeth Maria Op 'T Root, Nederweert (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/507,237

(22) PCT Filed: Aug. 21, 2015

(86) PCT No.: PCT/EP2015/069209
§ 371 (c)(1),
(2) Date: Feb. 27, 2017

(87) PCT Pub. No.: WO2016/041733
PCT Pub. Date: Mar. 24, 2016

(65) Prior Publication Data
US 2017/0307977 A1 Oct. 26, 2017

(30) Foreign Application Priority Data

Sep. 15, 2014 (EP) .................................... 14184776

(51) Int. Cl.
*G03F 7/20* (2006.01)
(52) U.S. Cl.
CPC ............ *G03F 7/70558* (2013.01); *G03F 7/20* (2013.01); *G03F 7/70008* (2013.01);
(Continued)

(58) Field of Classification Search
CPC .... G03F 7/20; G03F 7/70008; G03F 7/70058; G03F 7/70358; G03F 7/70558; G03F 7/709

See application file for complete search history.

(56) References Cited

U.S. PATENT DOCUMENTS

2012/0147346 A1  6/2012  Van Schoot et al.

FOREIGN PATENT DOCUMENTS

| CN | 101339367 | 1/2009 |
|---|---|---|
| EP | 1 174 769 | 1/2002 |

(Continued)

OTHER PUBLICATIONS

International Preliminary Report on Patentability dated Mar. 30, 2017 in corresponding International Patent Application No. PCT/EP2015/069209.

(Continued)

*Primary Examiner* — Michelle M Iacoletti
(74) *Attorney, Agent, or Firm* — Pillsbury Winthrop Shaw Pittman LLP

(57) ABSTRACT

A lithographic apparatus including: a radiation system; a frame; a substrate table for holding a substrate; and a scanning mechanism. The radiation system is operable to produce a radiation beam. The substrate table is moveably mounted to the frame and arranged such that a target portion of the substrate is arranged to receive the radiation beam. The scanning mechanism is operable to move the substrate table relative to the frame so that different portions of the substrate may receive the radiation beam. A mechanism is operable to determine a quantity indicative of a velocity of the radiation system relative to the frame. An adjustment mechanism is operable to control a power or irradiance of the radiation beam so as to reduce a variation in a dose of (Continued)

radiation received by the substrate as a result of relative motion of the radiation system and the frame.

20 Claims, 4 Drawing Sheets

(52) U.S. Cl.
CPC .......... *G03F 7/709* (2013.01); *G03F 7/70058* (2013.01); *G03F 7/70358* (2013.01)

(56) References Cited

FOREIGN PATENT DOCUMENTS

| WO | WO 2013/098053 | 7/2013 |
| WO | WO 2013/186919 | 12/2013 |

OTHER PUBLICATIONS

International Search Report and Written Opinion dated Oct. 29, 2015 in corresponding International Patent Application No. PCT/EP2015/069209.

LITHOGRAPHIC APPARATUS AND METHOD

CROSS-REFERENCE TO RELATED APPLICATIONS

This application is the U.S. national phase entry of PCT patent application no. PCT/EP2015/069209, which was filed on Aug. 21, 2015, which claims the benefit of priority of European patent application no. 14184776.4, which was filed on Sep. 15, 2014, and which is incorporated herein in its entirety by reference.

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called scanners, in which each target portion is irradiated by scanning the pattern through the beam in a given direction (the "scanning"-direction) while synchronously scanning the substrate parallel or anti parallel to this direction.

It is desirable to provide a lithographic apparatus that allows one to accurately control the dose of radiation received by each point on the target portion of the substrate. The dose of radiation received by a part of the target area of the substrate may be defined as the amount of energy per unit area which is received by that part. Accurate control of the dose of radiation in turn allows variation of the critical dimension of features formed on the substrate to be controlled.

It is an object of the present invention to provide a lithographic apparatus and a device manufacturing method that at least partially addresses one or more of the problems of the prior art, whether identified herein or elsewhere.

SUMMARY

According to an aspect of the invention, there is provided a lithographic apparatus comprising: a radiation system operable to produce a radiation beam; a frame; a substrate table for holding a substrate, the substrate table being moveably mounted to the frame and arranged such that a target portion of the substrate is arranged to receive the radiation beam; a scanning mechanism operable to move the substrate table relative to the frame; and a mechanism operable to determine a quantity indicative of a velocity of the radiation system relative to the frame; wherein the radiation system is provided with an adjustment mechanism that is operable to control a power of the radiation beam in dependence on the quantity indicative of a velocity of the radiation system relative to the frame so as to reduce a variation in a dose of radiation received by the substrate as a result of relative motion of the radiation system and the frame.

The radiation beam may be projected onto the target portion of the substrate as a band of radiation and, by moving the substrate table, the lithographic apparatus is operable to move the substrate relative to this band of radiation. During a scanning exposure, the dose of radiation delivered to a point on the substrate is given by a time integral of the irradiance of the radiation beam for that point. The dose of radiation received by a given point on the substrate is therefore dependent upon the velocity at which the band of radiation moves over the surface of the substrate. For example, if the power of the radiation beam remains constant, the smaller the velocity at which the band of radiation moves over the surface of the substrate the larger the dose of radiation will be.

Any relative movement of the radiation system and the frame will affect the velocity at which the band of radiation moves over the surface of the substrate and therefore the dose of radiation received by the substrate. For example, the radiation system may be loosely mechanically coupled to the frame such that movement of the substrate table relative to the frame by the scanning mechanism may cause the radiation system to vibrate relative to the frame. Any such vibration in the direction of motion of the substrate table relative to the frame will cause the velocity at which the band of radiation moves over the surface of the substrate, and therefore the dose of radiation received by the substrate, to oscillate with time. The first aspect of the invention allows such variation in the dose received by the substrate to be at least partially compensated for by varying the power of the radiation beam.

In general, it is desirable to have accurate control over the dose of radiation received by each point on the substrate, the dose being defined as the amount of energy per unit area which is received by the substrate. For example, it may be desirable to control the dose sufficiently accurately that variation of the critical dimension of features formed on the substrate is below a desired threshold.

The mechanism operable to determine a quantity indicative of a velocity of the radiation system relative to the frame may comprise an accelerometer mounted on the radiation system. The mechanism operable to determine a quantity indicative of a velocity of the radiation system relative to the frame may comprise a plurality of accelerometers mounted on the radiation system or both the radiation system and the frame.

The mechanism operable to determine a quantity indicative of a velocity of the radiation system relative to the frame may comprise a camera mounted on the frame which is operable to measure movement of a band of radiation exiting the radiation system. The mechanism operable to determine a quantity indicative of a velocity of the radiation system relative to the frame may comprise a plurality of cameras mounted on the frame which are operable to measure movement of a band of radiation exiting the radiation system.

The adjustment mechanism may be operable to control the power of the radiation beam such that it is equal to a base power multiplied by a factor that is dependent on the quantity indicative of a velocity of the radiation system relative to the frame. The base power may be a power that would achieve a desired dose of radiation when the radiation system is stationary relative to the frame. The factor may vary with time. The base power may be substantially time independent. Alternatively, the base power may vary with time. For example, the base power may be varied to at least partially compensate for one or more time dependent variations within the lithographic apparatus.

The factor may be proportional to a vector sum of a scan velocity of the substrate table relative to the frame and a velocity of the radiation beam in a scanning direction, relative to the frame, in the plane of the substrate. The factor may be the ratio of said sum to the scan velocity of the substrate table relative to the frame. The velocity of the radiation beam in a scanning direction, relative to the frame, in the plane of the substrate may be given by the velocity of the radiation system relative to the frame divided by a reduction factor that is applied to the radiation beam between the radiation system and the plane of the substrate.

The factor may comprise one or more tuneable parameters. For example, the factor may be proportional to a vector sum of a scan velocity of the substrate table relative to the frame and a product of a parameter $f$ and the velocity of the radiation beam in a scanning direction, relative to the frame, in the plane of the substrate. The factor may be the ratio of said sum to the scan velocity of the substrate table relative to the frame.

The radiation system may comprise a radiation source operable to produce a radiation beam and an illumination system operable to condition the radiation beam.

The radiation system may comprise an exit slit. The exit slit may form part of the illumination system. The exit slit may be provided with one or more moveable adjustable fingers. The exit slit may further comprise two movable blades. Each blade may be movable between at least a position wherein it at least partially obscures the slit and a position wherein it does not obscure the slit. Each blade may be movable to a position wherein it completely obscures the slit.

The lithographic apparatus may further comprise a support structure for supporting a patterning device. The radiation system may be arranged to project the radiation beam onto the patterning device such that the patterning device imparts a pattern to its cross-section before it is received by the target portion of the substrate. The support structure may be moveably mounted to the frame and the scanning mechanism may be further operable to move the support structure relative to the frame.

The lithographic apparatus may further comprise a projection system for projecting the radiation beam onto the target portion of the substrate as a band of radiation. The projection system may be connected to the frame.

The radiation system may comprise a laser. The laser may be an excimer laser.

According to a second aspect of the invention there is provided a method comprising: providing a substrate; providing a beam of radiation using a radiation system; using a patterning device to impart the radiation beam with a pattern in its cross-section; projecting the patterned radiation beam onto a target portion of the substrate; using a scanning mechanism to move the substrate relative to a frame such that the patterned radiation beam moves over a surface of the substrate; determining a quantity indicative of a velocity of the radiation system relative to the frame; and controlling a power of the radiation beam such that it is dependent on the quantity indicative of a velocity of the radiation system relative to the frame so as to reduce a variation in a dose of radiation received by the substrate as a result of relative motion of the radiation system and the frame.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
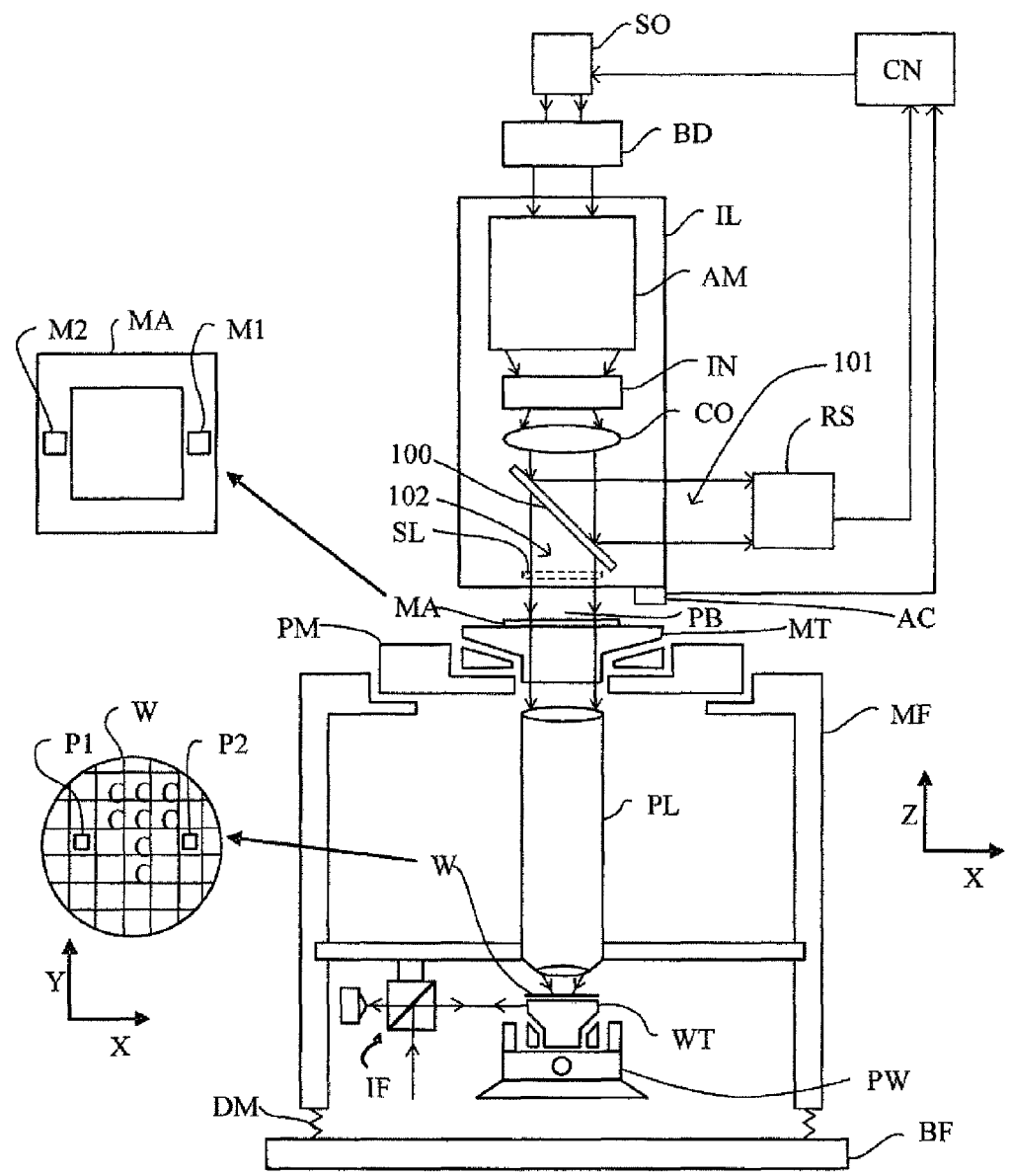
FIG. 1 depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may have a single substrate table and a single support structure. Alternatively, the lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

an illumination system (illuminator) IL to condition a beam PB of radiation (e.g. UV radiation or DUV radiation);

a frame MF;

a base frame BF;

a support structure (e.g. a mask table) MT to support a patterning device (e.g. a mask) MA;

a substrate table (e.g. a wafer table) WT for holding a substrate (e.g. a resist coated wafer) W; and a projection system (e.g. a refractive projection lens) PL configured to image a pattern imparted to the radiation beam PB by patterning device MA onto a target portion C (e.g. comprising one or more dies) of the substrate W.

The base frame BF may be supported on the ground. The frame MF is a vibration isolated frame that is substantially isolated from external influences, such as vibrations in the base frame BF, by the use of acoustically damping mounts DM, which support the frame MF on the base frame BF. These acoustically damping mounts DM may be actively controlled to isolate vibrations which are introduced by the base frame BF and/or by the isolated frame MF itself.

The projection system PL is connected to the isolated frame MF. The support structure MT is movably mounted to the frame MF via a first positioning device PM. The first positioning device PM may be used to move the patterning device MA, and to accurately position it, relative to the frame MF (and the projection system PL which is connected to the frame MF). The substrate table WT is movably mounted to the frame MF via a second positioning device PW. The second positioning device PW may be used to move the substrate W, and to accurately position it, relative to the frame MF (and the projection system PL which is connected to the frame MF). The second positioning device PW may be referred to as a scanning mechanism. Alternatively, the first and second positioning devices PM, PW may be collectively referred to as a scanning mechanism. The support structure MT and the substrate table WT may be referred to collectively as object tables.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The illuminator IL may be referred to as a radiation system. Alternatively, the source SO and the illuminator IL, together with the beam delivery system BD if required, may be collectively referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO.

The shape and intensity distribution of the conditioned beam of radiation PB are defined by optics of the illuminator IL. The illuminator IL comprises a slit SL through which the conditioned beam of radiation PB passes. The slit SL comprises an elongate, generally rectangular aperture defined by a plurality of movable fingers. The slit may have a longer dimension (which may be referred to as its length) and a shorter dimension (which may be referred to as its width). Each movable finger is independently movable between at least a retracted position wherein it is not disposed in the path of the radiation beam and an inserted position wherein it partially blocks the radiation beam. By moving the fingers, the shape and/or the intensity distribution of the slit SL can be adjusted. The fingers are not in a field plane and the field will be in the penumbra of the fingers. Therefore the fingers do not sharply cut off the radiation beam PB. Movement of the fingers between their retracted and inserted positions may be in a direction perpendicular to the length of the slit SL. The fingers may be arranged in pairs, each pair comprising one finger on each side of the slit SL. The pairs of fingers may be arranged along the length of the slit SL. The pairs of fingers may be used to apply a different level of attenuation of the radiation beam PB along the length of the slit SL.

The intensity distribution of the radiation beam PB may be dependent upon the positions of the plurality of fingers (and the optics of the illuminator IL). The intensity function of the radiation beam PB may vary across the width of the slit SL, which may correspond to a scanning direction. The shape of the intensity function across the width of the slit SL may be referred to as a profile of the radiation beam PB. The profile of the radiation beam PB may be substantially the same along the length of the slit SL. Additionally or alternatively, the integral of the intensity profile of the radiation beam PB across the width of the slit SL may be substantially constant along the length of the slit SL. This may be achieved by inserting the pairs of fingers into the path of the radiation beam PB by different amounts so as to attenuate the radiation beam by different amounts along the length of the slit SL. For such embodiments, where the pairs of fingers are inserted into the path of the radiation beam PB by different amounts, the profile of the radiation beam PB will vary slightly along the length of the slit SL.

The illuminator IL comprises two blades (not shown). Each of the two blades is generally parallel to the length of the slit SL, the two blades being disposed on opposite sides of the slit. Each blade is independently movable between a retracted position wherein it is not disposed in the path of the radiation beam and an inserted position wherein it partially blocks the radiation beam. By moving the blades into the path of the radiation beam, the profile of the radiation beam PB can be truncated thus limiting the extent of the field of radiation beam PB in a scanning direction.

The illuminator IL provides a conditioned beam of radiation PB, having a desired uniformity and intensity distribution in its cross section.

The radiation beam PB exiting the slit SL of the illuminator IL is incident on the patterning device (e.g. mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately relative to the frame MF, e.g. so as to position different target portions C in the path of the beam PB. Similarly, the first positioning device PM and another position sensor (which is not explicitly depicted in FIG. 1) can be used to accurately position the patterning device MA with respect to the frame MF, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. Patterning device MA and substrate W may be aligned using patterning device alignment marks M1, M2 and substrate alignment marks P1, P2.

The projection system PS may apply a reduction factor to the radiation beam PB, forming an image with features that are smaller than corresponding features on the patterning device MA. For example, a reduction factor of 4 may be applied.

The depicted apparatus can be used in a scan mode. In the scan mode, the support structure MT and the substrate table WT are scanned synchronously while a pattern imparted to the beam PB is projected onto a target portion C (i.e. a single dynamic exposure). In some embodiments, the support structure MT and the substrate table WT are scanned in opposite directions. The velocity and direction of the substrate table WT relative to the support structure MT may be determined by the (de-)magnification and image reversal characteristics of the projection system PL. For example, for embodiments wherein the projection system PS applies a reduction factor of N, the speed of the support structure MT may be greater than the speed of the substrate table WT by a factor of N. In scan mode, the maximum size of the exposure field limits the width (in the non-scanning direction) of the target portion in a single dynamic exposure, whereas the length of the scanning motion determines the height (in the scanning direction) of the target portion.

In the scan mode, the projection system PL focuses the beam of radiation (as a band of radiation) at an exposure region in a plane of the substrate W. The blades of the illuminator IL may be used to control the width of the band of radiation within the exposure region. At the start of a single dynamic exposure of a target portion C, a first one of the blades of the slit SL may be disposed in the path of the radiation beam, acting as a shutter, such that no part of the exposure region receives radiation. As a leading edge of the target portion C of the substrate moves into the exposure region, the first blade moves such that only the portion of the target region C that is disposed in the exposure region receives radiation (i.e. no parts of the substrate outside of the target region are exposed). Midway through the exposure of the target portion C, both blades may be retracted out of the path of the radiation beam such that the entire exposure region receives radiation. As the leading edge of the target portion C of the substrate moves out of the exposure region, a second one of the blades moves such that only the portion of the target region C that is disposed in the exposure region receives radiation.

Alternatively, the depicted apparatus can be used in another mode, wherein the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The radiation source SO delivers radiation to the lithographic apparatus for projection as a band of radiation on to the substrate W. By moving the substrate table WT relative to the frame MF (and the projection system PL), the lithographic apparatus is operable to move the substrate W relative to the band of radiation at a scan velocity $v_0$. Note that for embodiments wherein the projection system PS applies a reduction factor to the radiation beam, the patterning device MA will move relative to the band of radiation at a different velocity. During exposure, the lithographic apparatus may be operable to move the substrate W relative to the band of radiation through a fixed distance. By doing this the lithographic apparatus may therefore be operable to expose a target portion C of substantially fixed area to radiation. For example, the target portion C may comprise part of, one or several dies. After exposure of a first target portion C, the lithographic apparatus may be further operable to move the substrate W relative to the projection system PL so that a second target portion C can be exposed to radiation. A single wafer may be exposed to radiation in a plurality of steps, each step involving the exposure of a target portion C followed by a movement of the substrate W.

In general, it is desirable to have accurate control over the dose of radiation received by each point on the substrate W, the dose being defined as the amount of energy per unit area which is received by the substrate W. It may be desirable to control the dose sufficiently accurately that variation of the critical dimension of features formed on the substrate W is below a desired threshold.

During a scanning exposure, the dose of radiation E(r) delivered to a point (at position r) on the substrate W is given by a time integral of the irradiance I(r,t) of the radiation for that point:

$$E(r) = \int_{t_1}^{t_2} I(r, t)dt, \tag{1}$$

where $t_1$ is the time at which a leading edge of the band of radiation passes position r and $t_2$ is the time at which a trailing edge of the band of radiation passes position r. The irradiance is the power received by the substrate W per unit area.

If the irradiance is assumed to be constant, the dose received by a given point on the substrate W is proportional to the time taken ($t_2-t_1$) for the band of radiation to pass that point. The time taken for the band of radiation to pass a given point is given by the ratio of the size of the band of radiation in the scanning direction to the velocity v at which the band of radiation moves over the substrate W. Therefore, the dose received by a given point on the substrate W is inversely proportional to the velocity v at which the band of radiation moves over the substrate W. To first order approximation, the velocity v at which the band of radiation moves over the substrate W is given by the scan velocity $v_0$ (i.e. the velocity of the substrate table WT relative to the frame MF).

During operation in a scan mode, the first and second positioning devices PM, PW are used to move the patterning device MA and the substrate W. In order to facilitate high throughput lithography, the support structure MT and the substrate table WT may undergo rapid accelerations and decelerations, which in turn may exert large forces on the base frame BF by which they are supported via the isolated frame MF. These induced forces are partially compensated by counter-moving balance masses but this compensation is not perfect and therefore some residual forces are exerted on the base frame BF. The residual forces on the base frame BF induce vibrations of the base frame BF. Although the illuminator IL may not be directly mounted on to the base frame BF, it is connected thereto and there is some physical coupling between the base frame BF and the illuminator IL. Therefore, the vibrations of the base frame BF are to some extent transmitted to illuminator IL (and other components that are directly or indirectly coupled on the base frame BF).

This results in vibrations of the illuminator IL, in general in all directions and in particular in the scanning direction. Such vibrations of the illuminator IL in the scanning direction result in a vibrating band of radiation on the patterning device MA and the substrate W. These vibrations may be considered to modulate the velocity v at which the band of radiation sweeps across the patterning device MA and substrate W. As a consequence, the dose of radiation received by the substrate W is modulated by the vibration.

The amplitude of the vibrations of the illuminator IL is dependent upon: the motion that is executed by the support structure MT and the substrate table WT; and the coupling between the illuminator IL and the base frame BF. The amplitude of the vibrations of the illuminator IL may, for example, be of the order of 10 µm. If the projection system PS applies a reduction factor of 4 to the radiation beam, this corresponds to vibrations of the band of radiation projected onto the substrate W with an amplitude of the order of 2.5 µm. If uncorrected, this may result in a significant variation in the dose of radiation received by different parts of the substrate W.

Embodiments of the invention are provided with: (a) a mechanism operable to determine a quantity indicative of a velocity of the illuminator IL relative to the frame MF; and (b) an adjustment mechanism that is operable to vary a power of the radiation beam PB in dependence on the quantity indicative of a velocity of the radiation system relative to the frame so as to at least partially compensate for any variation in dose of radiation received by the substrate W as a result of relative motion of the illuminator IL and the frame MF.

An embodiment of a mechanism operable to determine a quantity indicative of a velocity of the illuminator IL relative to the frame MF is now described. An accelerometer AC is mounted on the illuminator IL. The accelerometer AC may be mounted close to the slit SL of the illuminator IL. The accelerometer AC is operable to measure the acceleration of the illuminator IL relative to the frame MF in the scanning direction. The measured acceleration is integrated over a resolution time, to calculate the instantaneous average velocity of the slit SL in the scanning direction during said resolution time.

In FIG. 1, accelerometer AC is operable to measure the acceleration of the illuminator IL relative to the frame of reference of the Earth. In some embodiments, a second accelerometer (not shown) may be mounted on the frame MF, which may be operable to measure the acceleration of the frame MF relative to the frame of reference of the Earth. In combination, the accelerometer AC mounted on the illuminator IL and the accelerometer mounted on the isolated frame MF can be used to determine the acceleration of the illuminator IL relative to the frame MF (in the scanning direction). However, as discussed above, in order to perform precision lithography, the frame MF is likely to be very well mechanically isolated from its surroundings by way of acoustically damping mounts DM, and therefore may be assumed to be at rest relative to the frame of reference of the Earth. A single accelerometer AC may therefore be used to determine the acceleration of the illuminator IL relative to the frame MF.

In one embodiment, accelerometer AC comprises three separate accelerometers that are each mounted close to the slit SL of the illuminator IL. This allows the acceleration (and the velocity) of the slit in the scanning direction (into the page in FIG. 1) to be decomposed into: a component that corresponds to linear motion of the slit in the scanning direction; a component that corresponds to rotations of the slit around the Z axis (see FIG. 1); and a component that corresponds to rotations of the slit around the X axis (see FIG. 1). The components that correspond to rotations of the slit around the X and Z axes do not contribute to the velocity of the band of radiation that sweeps over the substrate W (but do affect the size of the exposure region) and are therefore discarded. Only the component that corresponds to linear motion of the slit in scanning direction is used to determine how the power of the radiation beam PB should be modulated.

The accelerometer AC is operable to determine the acceleration of the illuminator IL in the scanning direction relative to the frame MF and to output a signal indicative thereof to a controller CN (shown in FIG. 1). The controller CN may comprise a microprocessor. The controller CN may be configured to integrate the measured acceleration over a resolution time to calculate the average velocity of the slit $v_s$ in the scanning direction during said resolution time.

Alternatively, the accelerometer AC may be configured to integrate the measured acceleration over a resolution time to calculate the average velocity of the slit $v_s$ in the scanning direction during said resolution time. The accelerometer AC may be further operable to output a signal indicative of the average velocity of the slit $v_s$ in the scanning direction during said resolution time to the controller CN.

The controller CN is further configured to output a control signal to the radiation source SO (e.g. laser), which control signal may be used to control one or more variables of the radiation source SO.

As discussed above, if the irradiance incident upon the substrate W is assumed to be constant, the dose received by a given point on the substrate W is inversely proportional to the velocity v at which the band of radiation moves over the substrate W. The velocity v at which the band of radiation moves over the substrate W is given by the (vector) sum of the scan velocity $v_0$ and the instantaneous velocity $v_b$ of the radiation beam PB in the scanning direction, relative to the isolated frame MF and in the plane of the substrate W. If no reduction factor is applied by the projection system, the velocity $v_b$ of the radiation beam PB in the scanning direction, relative to the isolated frame MF and in the plane of the substrate W is equal to the velocity of the slit $v_s$. For embodiments wherein the projection system PS applies a reduction factor of N, the velocity $v_b$ of the radiation beam PB in the scanning direction, relative to the isolated frame MF and in the plane of the substrate W is given by $v_s/N$. Therefore, in an embodiment of the invention, the controller is operable to output a control signal to the radiation source SO (e.g. laser) which controls the power of the radiation source SO according to:

$$P(t) = P_0(t)\frac{(v_0 + v_b(t))}{v_0}, \quad (2)$$

where P(t) is the power of the radiation source and $P_0(t)$ is a base power that would be required to achieve a given dose of radiation in the absence of any relative movement of the illuminator IL and the frame MF (i.e. for $v_b=v_s=0$). For a continuous radiation source, the power P(t) of the radiation source may be a continuous function of time. Alternatively, for a pulsed radiation source, the power P(t) of the radiation source may comprise a plurality of temporally spaced pulses. For a pulsed radiation source, the energy of each pulse may be chosen according to Eq. (2), where P(t) is the energy of a pulse at time t and $P_0(t)$ is a base pulse energy that would be required to achieve a given dose of radiation in the absence of any relative movement of the illuminator IL and the frame MF. It will be appreciated that the sum of the scan velocity $v_0$ and the instantaneous velocity of the radiation beam $v_b(t)$ in Eq. (2) is a vector sum. The scan velocity $v_0$ is the velocity of the substrate W (not the patterning device MA) relative to the frame MF. In general the velocity of the substrate W relative to the frame MF is different to the velocity of the patterning device MA relative to the frame MF.

The rate at which the instantaneous velocity $v_b$ of the radiation beam PB (or, equivalently, the velocity of the slit $v_s$) is determined should be higher than the typical frequency of the vibrations of the illuminator IL relative to the frame MF. Due to the nature of the coupling between the illuminator IL and the frame MF, the frequency of any induced vibration of the illuminator IL may be relatively low. For example, only frequencies below 80 Hz, and in some embodiments only frequencies below 30 Hz, may be excited. The sample rate of the accelerometer may be, for example, of order 100-200 Hz. For embodiments wherein the radiation source SO produces a pulsed beam of radiation, the rate at which the instantaneous velocity of the slit $v_s$ is determined does not need to be as high as the repetition rate of the radiation source SO, which may be of the order of a few kiloHertz. For pulses of radiation generated between two determinations of the velocity of the slit $v_s$ by the accelerometer AC, the velocity of the slit $v_s$ may be estimated using interpolation or extrapolation.

Controlling the power of the radiation source (or, for a pulsed radiation source, the pulse energy of each of pulse) according to Eq. (2) may be sufficient to reduce any variation in dose of radiation received by the substrate W as a result of relative motion of the illuminator IL and the frame MF to an acceptable level. However, in general the irradiance incident upon the substrate W may vary with time. The irradiance (see Eq. (1)) is the power received by the substrate W per unit area and is given by:

$$I(r,t)=I_{SO}(t) \times s(r,t) \times m(r) \quad (3)$$

where the $I_{SO}(t)$ is a power density of the radiation beam; s(r,t) is a dimensionless distribution which describes a spatial profile of the band of radiation output by the illuminator IL; and m(r) is a dimensionless distribution that represents the pattern imparted on the radiation beam by the patterning device MA. In the following discussion, for simplicity, the contribution to energy dose that arises from the pattern imparted on the radiation beam by the patterning device MA is ignored. Therefore in the following, the value of m is set at m=1.

The profile s(r,t) of the band of radiation is dependent upon the optical components of the illuminator IL. In particular, it is dependent upon the optics of the illuminator IL and the slit SL (as defined by the plurality of independently movable fingers). In general, a point r on the substrate W may be defined by two coordinates x, y. For example, coordinate y may define the position of r in a scan direction and coordinate x may describe the position of r in a direction substantially perpendicular to the scanning direction. The value of the dimensionless distribution s(r,t) may be dependent upon the position of r in a scanning direction (y) and may be independent of the position of r perpendicular to the scanning direction (x). For such embodiments, the profile of radiation may be described by a one dimensional function $f(y)$, which describes a general shape of the profile of the radiation in the scanning direction, evaluated at y=vt. The profile of the band of radiation in the scanning direction may have any convenient shape such as, for example, a 'top-hat' shape, a trapezoid like shape, or a truncated Gaussian (or 'Gaussian-like') shape.

From Eq. 1 it can be seen that when no mask MA is present (i.e. m=1) the dose E(y) received by a point (position y) on the substrate is given by a convolution of the profile of the band of radiation and the power density of the radiation source.

The radiation source SO may produce a radiation beam which is pulsed with a pulse frequency $f_p$. For example, the radiation source SO may comprise a laser (e.g. an excimer laser) which produces a pulsed radiation beam having a pulse frequency $f_p$. For such an arrangement, the dose of radiation which is received by a given point on the substrate W is a sum (over all pulses which irradiate that given point) of the doses of radiation delivered by each pulse. The number of pulses which contribute to the dose for a given point is dependent upon: the time taken for that point to sweep past the band of radiation; the pulse frequency $f_p$; and the phase of the radiation pulse train as the given point passes the leading edge of the profile, i.e. the amount of time which passes between the given point passing the leading edge of the profile and the first pulse irradiating it. The time taken for the band of radiation to sweep past a point is given by the ratio of the width of the band of radiation to the velocity v at which the substrate W moves relative to the radiation.

For embodiments utilising a pulsed radiation source SO, the power density of the radiation beam will be dependent upon the pulse train of the radiation source. For example, $$I_{SO}(t)=I_0(t) \times p(t), \quad (5)$$

where $I_0(t)$ is an amplitude of the power density of the radiation source and p(t) is a dimensionless pulse waveform. $I_0(t)$ may be viewed as the power density of an equivalent continuous radiation source and the pulse waveform describes how this is sampled at the pulse frequency $f_p$. The pulsed radiation may have any pulse train. The shape, duration and frequency of the pulses may be chosen as desired or required. The pulse frequency may, for example, be around 6 KHz, which is equivalent to a pulse time period of around 0.17 ms (although other pulse frequencies may be used). The duration of the pulses may be significantly smaller than the time period of the pulse train. For example, the ratio of the time period of the pulse train to the duration of the pulses may be of the order of 1000 (or may be some other value). The duration of the pulses may, for example, be around 150 ns (although other pulse durations may be used).

In an embodiment of the invention, the controller CN is operable to output a control signal to the radiation source SO (e.g. laser) which controls the power of the radiation source (or the pulse energy of each of pulse of a pulsed radiation source) in a way that is dependent upon the relative velocity $v_s$ of the illuminator IL and which is different to Eq. (2). In particular, it may use a parameterization which takes into account a more accurate analysis of the irradiance incident upon the substrate W. For example, the controller CN may be operable to output a control signal to the radiation source SO (e.g. laser) which controls the power of the radiation source according to:

$$P(t) = P_0(t) \frac{(v_0 + f v_b(t))}{v_0}, \quad (6)$$

where $f$ is a parameter, which may be close to but not equal to 1. For example, $f$ may be around 0.995.

The value of parameter $f$ may be chosen so as to optimize the reduction in dose variation over the surface of the substrate W. The value of parameter $f$ may be dependent upon the optics of the illuminator IL. In particular, parameter $f$ may be dependent on the shape of the intensity distribution in a pupil plane of the illuminator IL (for example, it may depend on the outer radial extent, the inner radial extent and/or the angular extent of the intensity distribution in a pupil plane of the illuminator IL). Additionally or alternatively, parameter $f$ may be dependent on the shape of the slit SL of the illuminator IL as defined by the positions of the plurality of independently movable fingers. Additionally or alternatively, parameter $f$ may be dependent on a numerical aperture of the illuminator IL. Additionally or alternatively, parameter $f$ may be dependent on the frequency spectrum of the vibrations of the illuminator IL.

Figure 2:
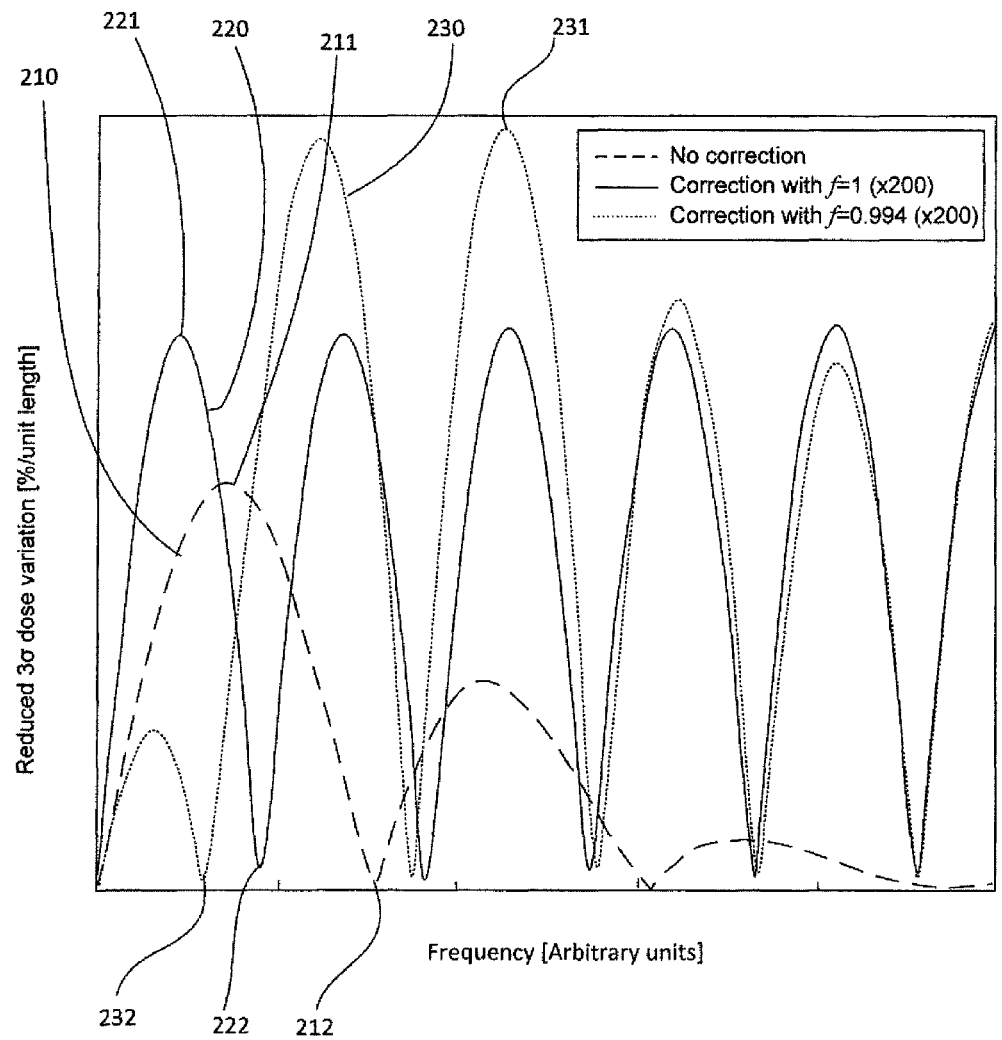
FIG. 2 shows a graph of a simulation of a three sigma dose variation (in reduced units) that results from a vibration (in a scanning direction) of an illuminator relative to a frame as a function of the frequency of the vibration for a first intensity distribution, when fingers of the illuminator are retracted.
Figure 3:
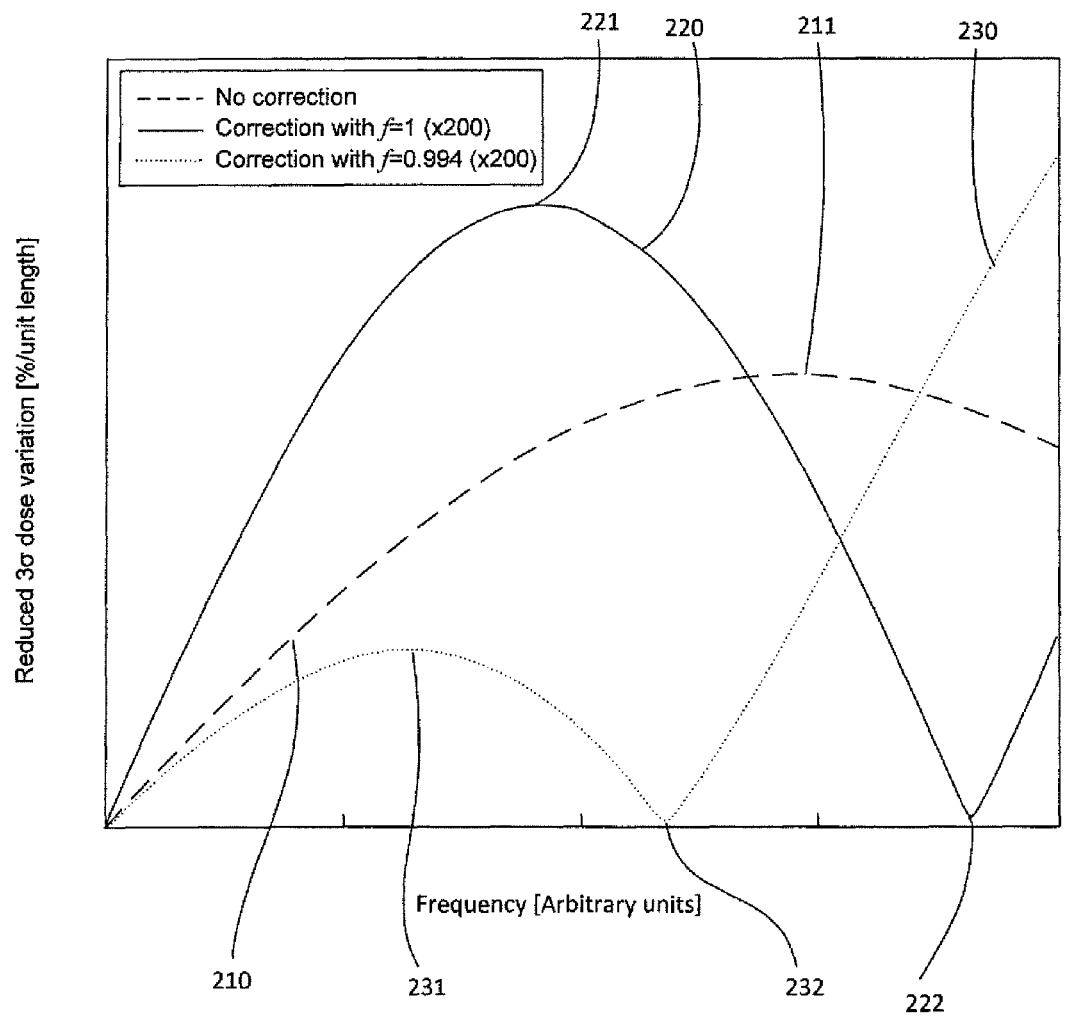
FIG. 3 shows an enlarged section of the graph of FIG. 2, shown on a smaller frequency scale.

FIGS. 2 and 3 show results of simulations of the three sigma dose variation (in reduced units) that results from a vibration of the illuminator IL relative to the frame MF as a function of the frequency of said vibration. The three sigma dose variation in reduced units is defined as the ratio of the three sigma dose variation (as a percentage) to the amplitude of the slit SL vibration (in arbitrary length unit). The three sigma dose variation is defined as the ratio of three times the standard deviation of the dose to the mean dose. FIG. 3 is an enlarged section of the graph of FIG. 2, shown on a smaller scale.

A first curve 210 illustrates the dose variation when no correction is made for relative movement of the illuminator IL and the frame MF. Curve 210 oscillates, having a number of periodic alternating maxima 211 and minima 212. The minima 212 correspond to vibration frequencies for which the exposure time of the substrate W (i.e. the time taken for the band of radiation to pass each point on the substrate) is approximately equal to an integral number of periods of the vibration. Further, the magnitudes of the periodic maxima 211 decrease as the frequency of the vibration increases.

A second curve 220 illustrates the dose variation multiplied by a factor of 200 (so that it is clearly visible on the same scale as curve 210) when a correction based on Eq. (2) is made for relative movement of the illuminator IL and the frame MF. Curve 220 also oscillates and has a number of periodic alternating maxima 221 and minima 222. The magnitudes of periodic maxima 221 are substantially the same.

A third curve 230 illustrates the dose variation multiplied by a factor of 200 (so that it is clearly visible on the same scale as curve 210) when a correction based on Eq. (6) is made for relative movement of the illuminator IL and the frame MF, with parameter $f$=0.994. Curve 230 also oscillates and has a number of periodic alternating maxima 231 and minima 232. The magnitudes of periodic maxima 231 oscillate as the frequency of the vibration increases.

All three curves 210, 220, 230 correspond to conditions wherein all of the fingers of the illuminator IL are fully retracted from the path of radiation beam PB. FIG. 2 illustrates that by applying a correction based on Eq. (2), at least for relatively low frequencies there is a reduction in the overall scale of the three sigma dose variation of the order of a factor of 100. Further, for relatively low frequencies a further (relatively small) reduction in the three sigma dose variation may be achieved by applying a correction based on Eq. (6) with $f$=0.994. At higher frequencies the reduction in the three sigma dose variation in reduced units achieved by applying a correction based on Eq. (6) with $f$=0.994 is smaller than the reduction achieved by applying a correction based on Eq. (2). Due to the nature of the coupling between the illuminator IL and the frame MF, one may expect any induced vibration of the illuminator IL to be at relatively low frequencies.

Figure 4:
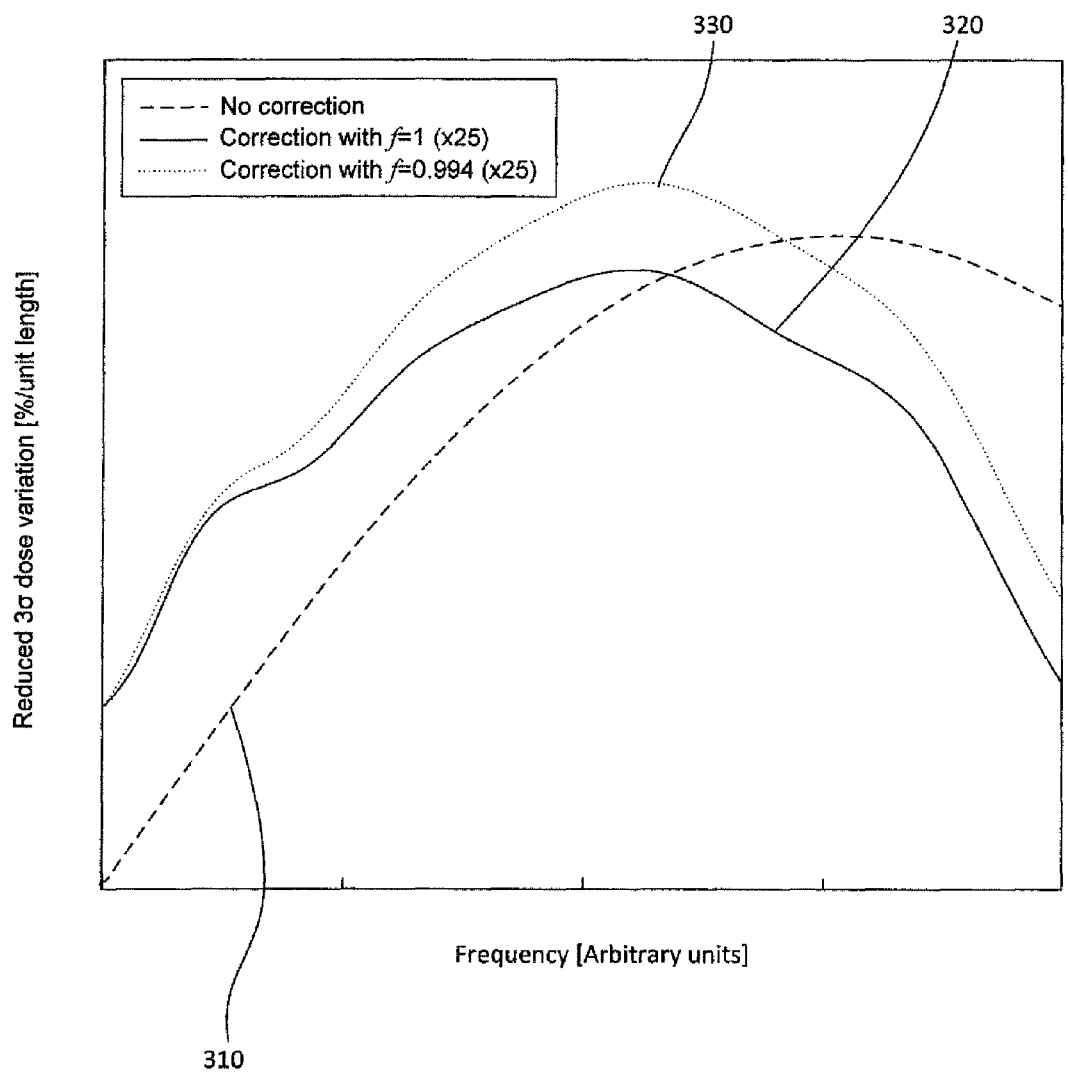
FIG. 4 shows a graph of a simulation of a three sigma dose variation (in reduced units) that results from a vibration of a illuminator relative to a frame as a function of the frequency of the vibration for a second intensity distribution, when fingers of the illuminator are partially inserted.

FIG. 4 shows results of simulations of the three sigma dose variation (in reduced units) that results from a vibration of the illuminator IL relative to the frame MF as a function of the frequency of said vibration when the fingers of the illuminator IL partially inserted into the path of radiation beam PB. In particular, the fingers are inserted into the path of the radiation beam PB so as to achieve an attenuation of the radiation beam PB of the order of 10%. A first curve 310 illustrates the dose variation when no correction is made for relative movement of the illuminator IL and the frame MF, a second curve 320 illustrates the dose variation multiplied by a factor of 25 (so that it is clearly visible on the same scale as curve 310) when a correction based on Eq. (2) is made, and a third curve 230 illustrates the dose variation multiplied by a factor of 25 (so that it is clearly visible on the same scale as curve 210) when a correction based on Eq. (6) is made with parameter $f=0.994$.

FIG. 4 illustrates that, with the fingers of the illuminator IL inserted to yield an attenuation of the order of 10%, by applying a correction based on Eq. (2) there is a reduction in the overall scale of the three sigma dose variation in reduced units, the reduction factor increasing as the frequency of the vibration increases. Further, with the fingers of the illuminator IL inserted to yield an attenuation of the order of 10% there is no real gain in the reduction achieved by applying a correction based on Eq. (6) with $f=0.994$. Therefore, there may be little advantage to using a parameterization wherein $f$ differs from 1. However, it should be noted that an attenuation of the order of 10% using the fingers is very high. In practice, an attenuation of less than 10% may be used and, in general, the level of attenuation will vary along the length of the slit SL of the illuminator IL.

A mechanism by which the energy or power of each pulse of a pulsed laser beam output by a laser may be adjusted is now described.

Energy is supplied to the radiation source SO. For example, for embodiments wherein the radiation source is a laser, energy may be supplied to the gain medium of the laser by an external source. This process is known as pumping, and the external source may comprise: an electrical power supply (electrical pumping), electromagnetic radiation (optical pumping), gas flow (gas dynamic pumping), or some other suitable energy source. The external power source may be adjustable, so that the amount of pump power supplied to the gain medium can be varied. The external power source may be provided with one or more input variables that can be varied so as to vary the power supplied to the gain medium. For example, in the case of a gas laser such as an excimer laser the external power source may comprise a pair of discharge conductors across which a high voltage is applied. For such embodiments, the power supplied to the gain medium can be varied by varying the voltage applied across the conductors. In the case of a gas discharge lamp such as a mercury lamp the external power source may comprise a pair of main electrodes across which a voltage is applied to establish and maintain an electric arc. For such embodiments, the power supplied to the gain medium can be varied by varying the voltage applied across the main electrodes.

In general, the power of the laser beam will be dependent upon the pump power supplied by the external power source. If a relationship between the one or more variables of the external power supply (e.g. a high voltage applied across a pair of discharge conductors) and the power of the beam is known, a desired power may be achieved by choosing the values of the variables accordingly. The relationship may be parameterized as a polynomial with one or more free parameters that may be determined during a calibration process. Furthermore, the relationship may vary with time and therefore it may be necessary to perform a calibration periodically.

For example, in the case of an excimer laser the power of the laser is dependent upon the high voltage V applied across the two conductors. In general, this relationship is non-linear. However, for a range of voltages V that are used in practice, a power P of the laser may be well approximated by a polynomial expansion of the voltage V. For a sufficiently small range of voltages V, the relationship between the power P and the voltage may be approximated by a linear relationship:

$$P=O+G\times V, \qquad (7)$$

where the gain G and the offset O of the laser are parameters which can be determined during a calibration process. For larger ranges of voltage, a higher order polynomial with more tuneable parameters may be necessary to parameterize the relationship between the voltage V and the power P.

In practice, the output power P of the radiation source SO (e.g. as measured by a radiation sensor) will include an element of noise. Therefore the calibration process may use data from an extended time period to evaluate the parameters used in the relationship between the one or more variables of the external power supply and the power. The values of the parameters may drift with time as the lithography apparatus is operating, and therefore the parameters may be determined periodically using the calibration process.

The power P may be measured by a radiation sensor RS. The radiation sensor RS may be any sensor suitable for measuring the energy of radiation incident upon the radiation sensor RS. For example the radiation sensor RS may be a photodiode. The radiation sensor RS may be positioned such that at least a portion of the radiation beam produced by the radiation source SO is incident upon the radiation sensor RS. For embodiments wherein only a portion of the radiation beam produced by the radiation source SO is incident upon the radiation sensor RS, the relationship between the dose received by the radiation sensor RS and the dose received by the substrate W should be known so that the latter can be determined from a measurement of the former.

An example positioning of the radiation sensor RS is depicted in FIG. 1. A partially transmissive mirror 100 is positioned in the illuminator IL. The partially transmissive mirror 100 reflects a first portion 101 of the radiation beam onto the radiation sensor RS. The remainder 102 of the radiation beam is transmitted by the partially transmissive mirror 100 and passes to the patterning device MA. The fraction of the radiation beam which is reflected by the partially transmissive mirror 100 (the first portion 101) may for example be of the order of a few percent or less of the radiation beam. If this fraction is known, the energy of the radiation beam 102 which is transmitted by the partially transmissive mirror 100 may be calculated using measurements made by the radiation sensor RS. If the fraction is not known, the radiation sensor RS may be calibrated with a second radiation sensor (not shown) by replacing the substrate with the second radiation sensor and comparing the energy measured by both radiation sensors.

In other embodiments the partially transmissive mirror 100 and the radiation sensor RS may be located at other positions along the path of the radiation beam. For example the partially transmissive mirror 100 and the radiation sensor RS may be positioned before the illuminator IL (e.g. in the beam delivery system).

Embodiments of the invention are operable to control a power of the radiation beam in dependence on the quantity indicative of a velocity of a radiation system relative to a frame so as to reduce a variation in a dose of energy received by a substrate as a result of relative motion of the radiation system and the frame. Therefore, the variation in the dose of energy received by the substrate as a result of relative motion of the radiation system and the frame is at least partially corrected for.

Although the above described embodiment uses an accelerometer AC mounted on the illuminator IL to determine an instantaneous velocity of the slit SL in the scanning direction other mechanisms operable to determine a quantity indicative of a velocity of the illuminator relative to the frame may alternatively be used. For example, one such mechanism may comprise a camera mounted on the frame MF which is operable to directly measure the movement of the band of radiation relative to the frame MF.

The power of a radiation beam is the rate at which it supplies energy. Power has units of energy per unit time (for example W). The irradiance of a radiation beam incident upon a surface is the power of the radiation beam per unit area that is incident upon that surface. Irradiance has units of energy per unit time per unit area (for example $Wm^{-2}$). In the above disclosure, the terms "power" and "irradiance" may be used interchangeably, the meaning being clear from the context of the use.

In the above disclosure, the amount of energy per unit area which is received by a substrate W may be referred to interchangeably as the "dose of radiation", the "dose of energy", the "energy dose" or the "dose".

Whilst the radiation source SO has been described as comprising a laser, the radiation source SO may be any form of radiation source SO. For example the radiation source SO may be an EUV radiation source (e.g. a discharge produced plasma source, a laser produced plasma source or a free electron laser) or a lamp type light source (e.g. a mercury discharge lamp).

Although an embodiment of the invention has been described above in the context of a DUV lithographic apparatus employing transmissive optics, it is also applicable to EUV lithographic apparatuses using reflective optics.

In an embodiment, there is provided a lithographic apparatus comprising: a radiation system operable to produce a radiation beam; a frame; a substrate table for holding a substrate, the substrate table being moveably mounted to the frame and arranged such that a target portion of the substrate is arranged to receive the radiation beam; a scanning mechanism operable to move the substrate table relative to the frame; and a mechanism operable to determine a quantity indicative of a velocity of the radiation system relative to the frame; wherein the radiation system is provided with an adjustment mechanism that is operable to control a power of the radiation beam in dependence on the quantity indicative of a velocity of the radiation system relative to the frame so as to reduce a variation in a dose of radiation received by the substrate as a result of relative motion of the radiation system and the frame.

In an embodiment, the mechanism operable to determine a quantity indicative of a velocity of the radiation system relative to the frame comprises one or more accelerometers mounted on the radiation system. In an embodiment, the mechanism operable to determine a quantity indicative of a velocity of the radiation system relative to the frame comprises one or more cameras mounted on the frame which are operable to measure movement of a band of radiation exiting the radiation system. In an embodiment, the adjustment mechanism is operable to control the power of the radiation beam such that it is equal to a base power multiplied by a factor that is dependent on the quantity indicative of a velocity of the radiation system relative to the frame. In an embodiment, the factor is proportional to a vector sum of a scan velocity of the substrate table relative to the frame and a velocity of the radiation beam in a scanning direction, relative to the frame, in the plane of the substrate. In an embodiment, the factor comprises one or more tuneable parameters. In an embodiment, the factor is proportional to a vector sum of: a scan velocity of the substrate table relative to the frame; and a product of a parameter f and a velocity of the radiation beam in a scanning direction, relative to the frame, in the plane of the substrate. In an embodiment, the factor is the ratio of said sum to the scan velocity of the substrate table relative to the frame. In an embodiment, the radiation system comprises a radiation source operable to produce a radiation beam and an illumination system operable to condition the radiation beam. In an embodiment, the radiation system comprises an exit slit. In an embodiment, the lithographic apparatus further comprises a support structure for supporting a patterning device, wherein the radiation system is arranged to project the radiation beam onto the patterning device such that the patterning device imparts a pattern in its cross-section before it is received by the target portion of the substrate. In an embodiment, the support structure is moveably mounted to the frame and wherein the scanning mechanism is further operable to move the support structure relative to the frame. In an embodiment, the lithographic apparatus further comprises a projection system for projecting the radiation beam onto the target portion of the substrate as a band of radiation. In an embodiment, the projection system is connected to the frame. In an embodiment, the radiation system comprises a laser.

In an embodiment, there is provided a method comprising: providing a beam of radiation using a radiation system; using a patterning device to impart the radiation beam with a pattern in its cross-section; projecting the patterned radiation beam onto a target portion of a substrate; using a scanning mechanism to move the substrate relative to a frame such that the patterned radiation beam moves over a surface of the substrate; determining a quantity indicative of a velocity of the radiation system relative to the frame; and controlling a power of the radiation beam in dependence on the quantity indicative of a velocity of the radiation system relative to the frame so as to reduce a variation in a dose of radiation received by the substrate as a result of relative motion of the radiation system and the frame.

In an embodiment, there is provided a method comprising: receiving a quantity indicative of a velocity of a radiation system relative to a frame; and providing instructions to a radiation source for controlling a power of a radiation beam output by the radiation source in dependence on the quantity indicative of a velocity of the radiation system relative to the frame so as to reduce a variation in a dose of radiation received by a substrate that moves relative to the frame as a result of relative motion of the radiation system and the frame.

In an embodiment, the quantity indicative of a velocity of the radiation system relative is an acceleration of the radiation system in a scanning direction and the method comprises the step of integrating the acceleration over a resolution time to calculate an average velocity of the of the radiation system in the scanning direction during said resolution time. In an embodiment, the instructions are for controlling the power of the radiation beam such that it is equal to a base power multiplied by a factor that is dependent on the quantity indicative of a velocity of the radiation system relative to the frame. In an embodiment, the factor is proportional to a vector sum of a scan velocity of the substrate relative to the frame and a velocity of the radiation beam in a scanning direction, relative to the frame, in the plane of the substrate. In an embodiment, the factor comprises one or more tuneable parameters. In an embodiment, the factor is proportional to a vector sum of: a scan velocity of the substrate relative to the frame; and a product of a parameter f and a velocity of the radiation beam in a scanning direction, relative to the frame, in the plane of the substrate. In an embodiment, the factor is the ratio of said sum to the scan velocity of the substrate table relative to the frame.

In an embodiment, there is provided a computer program operable to implement any of the methods herein.

While specific embodiments of the invention have been described above, it will be appreciated that the invention may be practiced otherwise than as described. The description is not intended to limit the invention.

The invention claimed is:

1. A lithographic apparatus comprising:
   a radiation system configured to provide a radiation beam;
   a frame;
   a substrate table configured to hold a substrate, the substrate table being moveably mounted to the frame and arranged such that a target portion of the substrate is arranged to receive the radiation beam;
   a scanning mechanism configured to move the substrate table relative to the frame;
   a mechanism configured to determine a quantity indicative of a velocity of the radiation system in a scanning direction, relative to the frame, in the plane of the substrate; and
   an adjustment mechanism configured to control a power of the radiation beam such that it is equal to a base power multiplied by a factor that is proportional to a vector sum of a scan velocity of the substrate table relative to the frame and the velocity of the radiation system in the scanning direction, relative to the frame, in the plane of the substrate, so as to reduce a variation in a dose of radiation received by the substrate as a result of relative motion of the radiation system and the frame.

2. The lithographic apparatus of claim 1, wherein the mechanism configured to determine the quantity indicative of a velocity of the radiation system relative to the frame comprises one or more accelerometers mounted on the radiation system.

3. The lithographic apparatus of claim 1, wherein the mechanism configured to determine the quantity indicative of a velocity of the radiation system relative to the frame comprises one or more cameras mounted on the frame which are operable to measure movement of a band of radiation exiting the radiation system.

4. The lithographic apparatus of claim 1, wherein the factor comprises one or more tuneable parameters.

5. The lithographic apparatus of claim 4, wherein the factor is proportional to a vector sum of: a scan velocity of the substrate table relative to the frame; and a product of a parameter f and a velocity of the radiation beam in a scanning direction, relative to the frame, in the plane of the substrate.

6. The lithographic apparatus of claim 1, wherein the factor is the ratio of the sum to the scan velocity of the substrate table relative to the frame.

7. The lithographic apparatus of claim 1, wherein the radiation system comprises a radiation source configured to produce a radiation beam and an illumination system configured to condition the radiation beam.

8. The lithographic apparatus of claim 1, wherein the radiation system comprises an exit slit and wherein the velocity radiation system in the scanning direction, relative to the frame, in the plane of the substrate is essentially equal to a velocity of the exit slit.

9. The lithographic apparatus of claim 1, further comprising a support structure configured to support a patterning device, wherein the radiation system is arranged to project the radiation beam onto the patterning device such that the patterning device imparts a pattern in its cross-section before it is received by the target portion of the substrate.

10. The lithographic apparatus of claim 9, wherein the support structure is moveably mounted to the frame and wherein the scanning mechanism is further configured to move the support structure relative to the frame.

11. The lithographic apparatus of claim 1, further comprising a projection system configured to project the radiation beam onto the target portion of the substrate as a band of radiation.

12. The lithographic apparatus of claim 11, wherein the projection system is connected to the frame.

13. The lithographic apparatus of claim 1, wherein the radiation system comprises a laser.

14. A method comprising:
   providing a beam of radiation using a radiation system;
   using a patterning device to impart the radiation beam with a pattern in its cross-section;
   projecting the patterned radiation beam onto a target portion of the substrate;
   using a scanning mechanism to move the substrate relative to a frame such that there is relative movement between the patterned radiation beam and a surface of the substrate;
   determining a quantity indicative of a velocity of the radiation system in a scanning direction, relative to the frame, in the plane of the substrate; and
   controlling a power of the radiation beam such that it is equal to a base power multiplied by a factor that is proportional to a vector sum of a scan velocity of the substrate table relative to the frame and the velocity of the radiation system in the scanning direction, relative to the frame, in the plane of the substrate, so as to reduce a variation in a dose of radiation received by the substrate as a result of relative motion of the radiation system and the frame.

15. A method comprising:
   receiving a quantity indicative of a velocity of a radiation system in a scanning direction, relative to a frame, in the plane of a substrate; and
   providing instructions to the radiation system for controlling a power of a radiation beam output by the radiation system such that it is equal to a base power multiplied by a factor that is proportional to a vector sum of a scan velocity of a substrate table relative to the frame and the velocity of the radiation system in the scanning direction, relative to the frame, in the plane of the substrate, so as to reduce a variation in a dose of radiation received by the substrate that moves relative to the frame as a result of relative motion between the radiation system and the frame.

16. The method of claim 15, wherein the quantity indicative of a velocity of the radiation system relative to the frame is an acceleration of the radiation system in a scanning direction and the method comprises integrating the acceleration over a resolution time to calculate an average velocity of the radiation system in the scanning direction during the resolution time.

17. The method of claim 15, wherein the factor comprises one or more tuneable parameters.

18. The method of claim 17, wherein the factor is proportional to a vector sum of: a scan velocity of the substrate relative to the frame; and a product of a parameter f and a velocity of the radiation beam in a scanning direction, relative to the frame, in the plane of the substrate.

19. The method of claim 15, wherein the factor is the ratio of the sum to the scan velocity of the substrate table relative to the frame.

20. A non-transitory computer readable medium comprising a computer program operable to cause a computer to:
receive a quantity indicative of a velocity of a radiation system in a scanning direction, relative to a frame, in the plane of a substrate; and
provide instructions for the radiation system to control a power of a radiation beam output by the radiation system such that it is equal to a base power multiplied by a factor that is proportional to a vector sum of a scan velocity of a substrate table relative to the frame and the velocity of the radiation system in the scanning direction, relative to the frame, in the plane of the substrate, so as to reduce a variation in a dose of radiation received by the substrate that moves relative to the frame as a result of relative motion between the radiation system and the frame.

* * * * *